United States Patent [19]
Gillespie et al.

[11] Patent Number: 5,666,431
[45] Date of Patent: Sep. 9, 1997

[54] VOLUME CONTROL FOR A PERSONAL COMPUTER INTERNAL SPEAKER

[75] Inventors: Gregory S. Gillespie; Thomas J. Glad, both of Nevada City, Calif.

[73] Assignee: TDK U.S.A. Corporation, Port Washington, N.Y.

[21] Appl. No.: 240,860

[22] Filed: May 10, 1994

[51] Int. Cl.⁶ .................................................. H03G 3/00
[52] U.S. Cl. ............................................. 381/109; 381/104
[58] Field of Search .................................... 381/104, 109, 381/107

[56] References Cited

U.S. PATENT DOCUMENTS 5,150,415  9/1992  Jaffee ............................... 381/104

*Primary Examiner*—Minsun Oh
*Attorney, Agent, or Firm*—Hecker & Harriman

[57] ABSTRACT

Method and apparatus for controlling the volume of an internal PC speaker. In the present invention, pulse width modulation (PWM) techniques are used to selectively reduce the signal power generated at the speaker. By substituting a high frequency signal having a symmetric duty cycle for portions of the digital audio signal, the average signal power is reduced. The frequency of the substitute signal is much higher than the speaker bandwidth, contributing negligible power to the output. The ratio of audio signal to high frequency signal determines the output signal level. In the preferred embodiment of the present invention, a three bit counter is used to separate the audio signal into intervals having eight states apiece. A signal providing −6 dB of attenuation is generated by substituting the toggling output from the least significant bit of the counter during four out of the eight states. A signal providing −12 dB of attenuation is generated by substituting the same toggling output during six out of the eight states. A multiplexer is provided to select between the two attenuated signals, an unattenuated signal and a DC signal (off).

7 Claims, 5 Drawing Sheets

VOLUME CONTROL FOR A PERSONAL COMPUTER INTERNAL SPEAKER

BACKGROUND OF THE INVENTION

1. Field of the Invention

The present invention relates to the field d personal computing, and in particular, to personal computer modem and I/O technology.

2. Background Art

Input/output (I/O) devices designed for personal computers (PCs) are constrained in their performance by the host PC's I/O standards, as well as physical limitations such as power supply and area allowances. For external devices, these physical limitations can be overcome by dedicated power supplies and larger device housings. For internal devices, those intended to reside inside the host PC housing in expansion card slots, etc., ways must be found to optimize the use of available PC resources. An example of this type of device is the internal modem used to interface the PC with other computer resources over standard phone lines.

As an audible cue to the user, voice band modems are designed to output analog call progress tones from the telephone line to a speaker. In an external modem, this speaker is often a dedicated portion of the modem hardware. For internal PC modems, an alternative to adding a speaker to the I/O card is to use the PC's internal speaker. This is especially important for modems in the PCMCIA environment where there is not room or power for amplifiers and speakers.

Most IBM PC compatibles and laptops provide the ability for I/O cards to drive the internal PC speaker directly. The I/O card interface is limited to a one-bit wide digital output for this purpose, and as such will typically use some form of zero crossing detector to convert the analog signal to a digital representation. This single bit quantization of the analog audio signal creates sharp transitions in the voice signal, effectively adding high frequency components to the voice signal. In addition, the voltage swing is maximized for the digital signal, such that even small analog signals are mapped into the full voltage range. Signal power is therefore relatively fixed near the upper limit.

The physical characteristics of the speaker provide for a frequency response similar to an integrator. The speaker's response, combined with some low pass filtering of the PC itself, removes much of the unwanted high frequency error introduced by the quantization process. The resulting audio signal is therefore of tolerable listening quality. However, the signal power, and therefore its volume, are fixed.

FIG. 1A shows a block diagram of the audio signal path beginning in the telephone line and ending at the PC internal speaker. The two-wire telephone line, comprised of "tip" line 104 and "ring" line 105, is coupled to telephone line interface 100. Telephone interface signal 100 provides analog audio signal 106 to digital comparator 101. Digital comparator 101 provides digital audio signal 107 to low pass filter block 102. Low pass filter 102 provides filtered audio signal 108 to speaker 103.

The circuit of FIG. 1A performs as follows. Typically, telephone interface 100 receives the twisted-pair differential line signal, having both transmit and receive signals, and converts it into two separate differential signals, one for the receive channel and one for the transmit channel. Additionally, the signal on lines 104 and 105 is subject to DC offset. The interface serves to place the analog signal within the limits of the system power supplies, providing a referenced signal. This referenced signal is then provided as signal 106 to digital comparator 101.

Digital comparator 101 outputs a digital "high" value, representing "1", when the differential signal is positive, i.e., the positive line is at a higher voltage level than the negative line. Comparator 101 outputs a digital "low" value, representing "0", when the differential signal is negative. This binary signal is passed as digital audio signal 107 to the PC through the card interface. Low pass filter 102 models the low pass characteristics of the PC and the speaker. The filter acts to soften the fast transitions of the digital signal, providing an output signal 108 with frequency characteristics similar to that of the original audio signal 106. However, the signal power is fixed at the maximum level for the system due to the saturating effect of the quantization process. This loud signal with tolerable sound quality is broadcast by speaker 103 to the user.

The electroacoustic transducer in the PC speaker may be of the electrodynamic, piezoelectric, or electrostatic type. They each have unique mechanical and electrical properties that can cause them to respond differently to the digital signal. It is thus desirable to be able to adjust the volume of the audio signal to compensate for the transducer variability, room acoustics and listener preferences. Previous PC I/O card applications using the PC's internal speaker have not provided the ability to control the loudness of the audio output.

SUMMARY OF THE PRESENT INVENTION

The present invention provides a method and apparatus for controlling the volume of an internal PC speaker. In the present invention, pulse width modulation (PWM) techniques are used to selectively reduce the signal power generated at the speaker. By substituting a high frequency signal having a symmetric duty cycle for portions of the digital audio signal, the average signal power is reduced. The frequency of the substitute signal is much higher than the speaker bandwidth, contributing negligible power to the output. The ratio of audio signal to high frequency signal determines the output signal level.

In the preferred embodiment of the present invention, a three bit counter is used to separate the audio signal into intervals having eight states apiece. A signal providing −6 dB of attenuation is generated by substituting the toggling output from the least significant bit of the counter during four out of the eight states. A signal providing −12 dB of attenuation is generated by substituting the same toggling output during six out of the eight states. A multiplexer is provided to select between the two attenuated signals, an unattenuated signal and a DC signal (off).

DETAILED DESCRIPTION OF THE PRESENT INVENTION

Figure 1A:
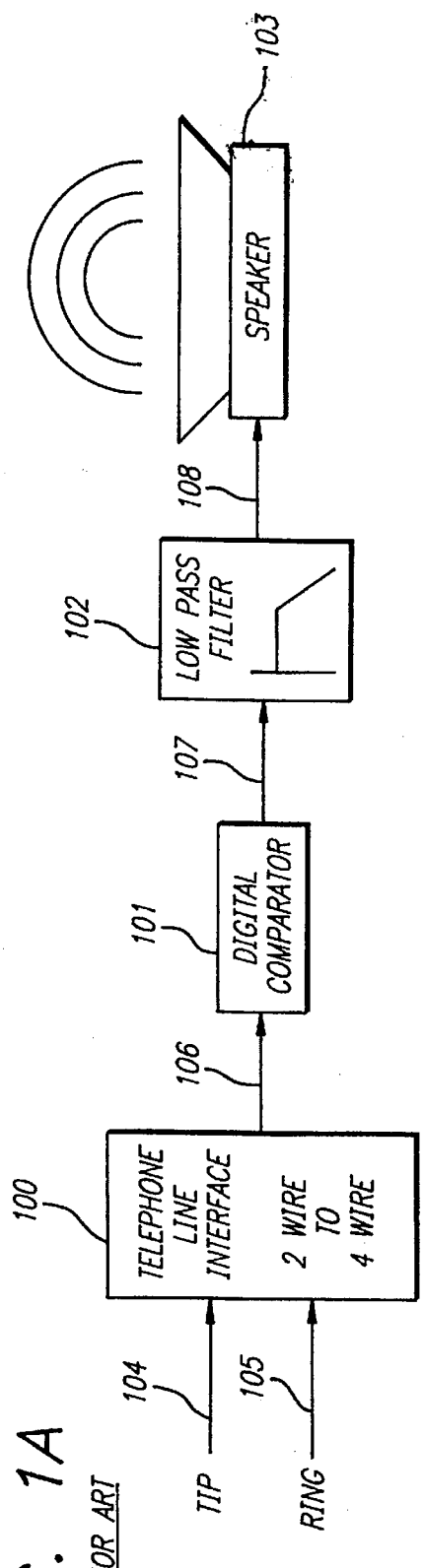
FIG. 1A is a block diagram of the audio signal path of the prior art.

A method and apparatus for controlling the volume of a PC internal speaker are described. In the following description, numerous specific details are described in order to provide a more thorough description of the present invention. It will be apparent, however, to one skilled in the art, that the present invention may be practiced without these specific details. In other instances, well-known features have not been described in detail in order not to unnecessarily obscure the present invention.

In card interface schemes of the prior art, analog audio signals are converted directly into a single bit digital signal to accommodate the PC card interface between the I/O card and the PC's internal speaker. Due to the low pass characteristics of the PC and the speaker, tolerable audio performance is achieved. However, the digital signal is limited to a single amplitude level dependent on the digital voltage supply. The volume of the audible output is fixed at one level regardless of user preference.

The present invention allows the user control over the modem's speaker without requiring additional sound reproduction circuitry on the modem card itself. The present invention is expandable to a wide range of attenuation steps and may be coupled with any source capable of producing a one bit audio signal.

The preferred embodiment of the present invention is employed as part of an internal PC modem. Although PC speakers vary considerably, it is generally true that for a given frequency the output sound pressure level is proportional to the range of excursion of the transducer's diaphragm. The present invention utilizes a pulse width modulation scheme to control the range of excursion. The speaker volume control limits the diaphragm excursions by modulating the input to the speaker at a rate much higher than the speaker's bandwidth. By selectively replacing the audio data with a high frequency clock signal it is possible to reduce the amount of audio signal energy that reaches the speaker.

In pulse width modulation (PWM), analog values are represented in a one-bit digital signal by generating pulses at a set frequency and making the width of these pulses proportional to the amplitude of the analog signal. The analog signal can be resynthesized from the digital signal by taking a moving average of the digital signal. This is easily accomplished by passing the digital signal through an analog low pass filter. Intervals with duty cycles consistently biased towards a logical "1" will generate "positive" analog voltage values between the midrange of the voltage supplies and the upper rail. Likewise, intervals heavily biased towards a logical "0" will generate "negative" voltage values between the midrange and the lower voltage rail. Provided that the initial analog signal frequency is within and the pulse frequency of the digital signal is well outside the bandwidth of the filter, a satisfactory restoration is achieved. Higher pulse frequencies yield better restoration results.

The present invention uses the averaging properties of the PC's low pass frequency response to regulate the range of the audio signal inside the PC speaker. By time multiplexing the audio signal with a high frequency clock signal having a 50% duty cycle (i.e., an average analog value of zero), the averaged audio output power is diminished.

The apparatus of the present invention comprises the digital logic circuitry necessary to modulate the audio signal. Inputs to the system comprise the unattenuated one bit audio signal, control bits to select the amount of attenuation, and a high speed digital clock signal. The output is the attenuated (modulated) one-bit digital audio signal. The input audio can be derived from an analog input through a zero crossing detector or it can be directly synthesized.

Figure 1B:
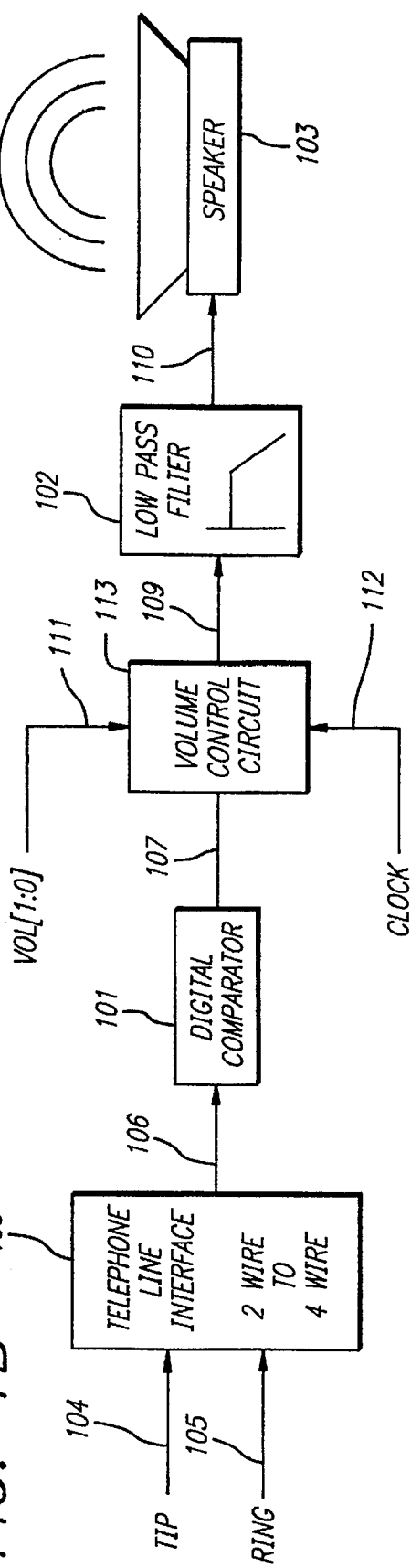
FIG. 1B is a block diagram of the audio signal path of the present invention.

FIG. 1B shows a block diagram of an audio signal path utilizing the apparatus of the present invention. The two-wire telephone line, comprised of "tip" and "ring" lines 104 and 105, is coupled to telephone line interface 100. Telephone interface signal 100 provides analog audio signal 106 to digital comparator 101. Digital comparator 101 provides digital audio signal 107 to volume control circuit 113. Volume control circuit 113 receives high frequency clock signal 112 and two volume control bits, VOL0 and VOL1. The modulated output 109 from volume control circuit 113 is provided to low pass filter 102. Low pass filter 102 provides filtered audio signal 110 to speaker 103.

As in FIG. 1A, blocks 100 and 101 of FIG. 1B operate as follows. Telephone interface 100 receives the twisted-pair differential line signal, having both transmit and receive signals, and converts it into two separate differential signals, one for the receive channel and one for the transmit channel. Additionally, the signal on lines 104 and 105 is subject to DC offset. The interface serves to place the analog signal within the limits of the system power supplies, providing a referenced signal. This referenced signal is then provided as signal 106 to digital comparator 101.

Digital comparator 101 outputs a digital "high" value, representing "1", when the differential signal is positive, i.e. the positive line is at a higher voltage level than the negative line. Comparator 101 outputs a digital "low" value, representing "0", when the differential signal is negative. This binary signal is passed as digital audio signal 107 to the volume control apparatus of the present invention.

Volume control circuit 113 modulates the digital audio signal 107 with a divided down version of clock signal 112 in a PWM scheme ratio dependent upon digital control signals VOL0 and VOL1. The modulated audio signal 109 is provided to the PC through the card interface. Low pass filter 102 models the low pass characteristics of the PC and the speaker. The filter acts to soften the fast transitions of the digital signal and performs the averaging required to turn the PWM signal into an analog waveform. The filtered signal 110 is then broadcast by speaker 103.

Figure 3A:
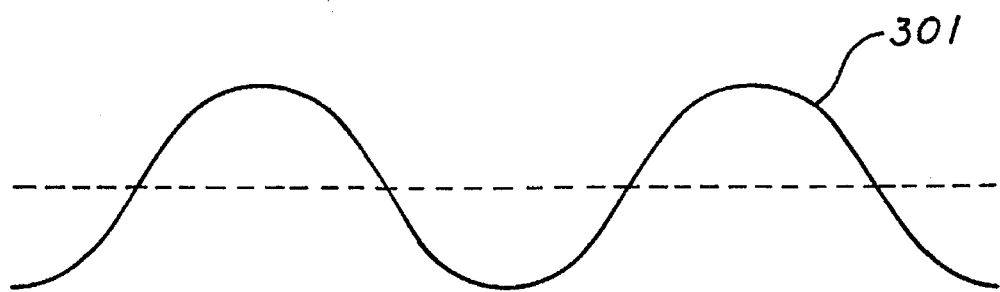
FIG. 3 is typical waveforms from selected signals in FIGS. 1A and 1B.
Figure 3B:
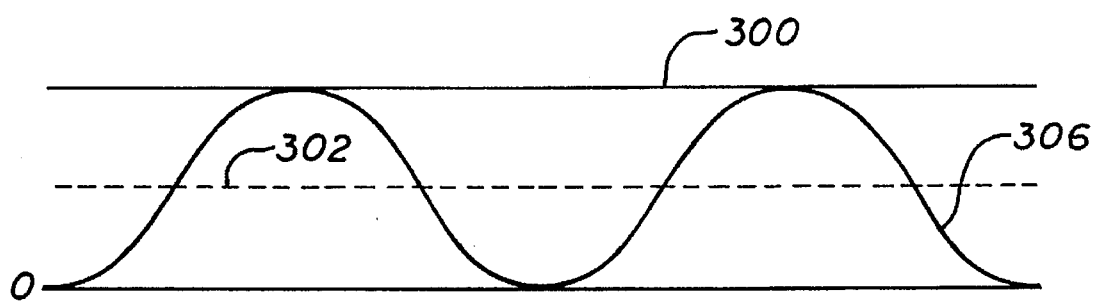

FIGS. 3A–E illustrate an example of a waveform at different nodes of the circuit of FIG. 1B. Waveform 301 in FIG. 3A represents the unreferenced differential analog signal from tip and ring lines 104 and 105 in FIGS. 1A–B. Waveform 301 does not have a reference ground plane and may contain some unwanted DC offset. Once converted into a referenced format by the telephone line interface, waveform 301 becomes waveform 306 in FIG. 3B. Waveform 306 corresponds to signal 106 in FIGS. 1A–B. In differential form, the AC amplitude 300 is easily separable from any DC offset, and zero crossings can be obtained with simple differential circuits. Zero crossings in FIG. 3B correspond to points where waveform 306 crosses the dashed center line 302.

Figure 3C:

In FIG. 3C, waveform 307 corresponds to signal 107 produced by comparator 101 in FIGS. 1A–B. Waveform 307 is a digital waveform having two stable states. When waveform 306 has a zero crossing in the positive direction, waveform 307 transitions to a logical high state. Similarly, when waveform 306 had a zero crossing in the negative direction, waveform 307 transitions to a logical low state. In this form, the frequency of the analog audio signal is maintained in waveform 307. However, the amplitude is saturated to either supply rail.

Figure 3D:
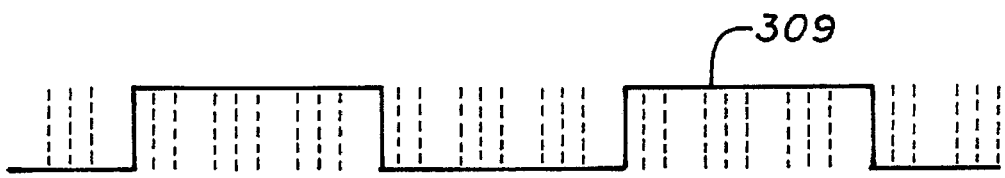
Figure 3E:
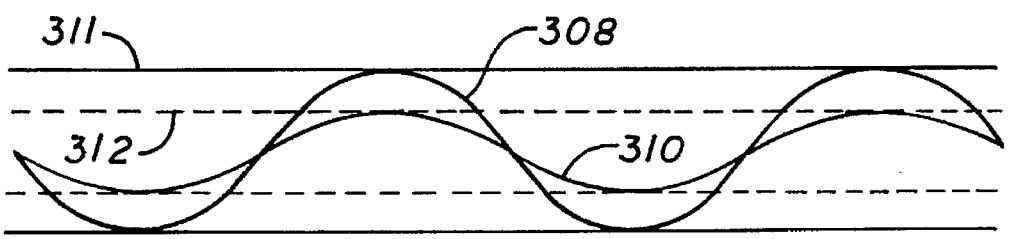

FIG. 3D shows a waveform with PWM reduction. Waveform 309 corresponds to signal 109 in FIG. 1B. Volume control circuit 113 in FIG. 1B inserts high frequency clock pulses into waveform 309 pursuant to the method of the present invention. Filtered waveforms are shown in FIG. 3E. Waveform 308, having amplitude 311, corresponds to signal 108 in FIG. 1A, and represents a filtered version of waveform 307 in FIG. 3C. The filtering softens the waveform into a signal that resembles the original signal shape with a tolerable amount of distortion. Amplitude 311 is determined by the voltage range of digital signal 307 and is therefore independent of the original audio signal 301.

Waveform 310, having amplitude 312, corresponds to signal 110 in FIG. 1B, and represents a filtered version of PWM waveform 309. Amplitude 312 is determined by the voltage range of waveform 309 and the ratio of audio signal to high frequency clock signal present in waveform 309. The average power of the filtered output waveform 310 can therefore be regulated by the volume control circuit of the present invention.

In the preferred embodiment of the present invention, attenuation of the audio signal sound level is performed in steps of −6 dB, reducing the audio power by a factor of two at each step. For this step size, the number of control bits (C) needed is C=log$_2$N where N is the number of audio levels. In the preferred embodiment, N=4 levels and the number of control bits is C=2. The frequency of the high speed clock is chosen such that it is at least 4N times the highest sample rate of the audio signal. In this case, if the audio signal is limited to 8000 samples/sec (4 kHz), then the clock rate is at least 16*8000 or 1.28 MHz. Also, the clock rate should be at least twice the cutoff frequency of the PC's speaker so that the carrier is not audible.

A modulo eight counter clocked at the modulator rate is used to divide the clock into eight distinct phases. During each phase, the values of the control bits, VOL1 and VOL0 (VOL [1:0]),are used to determine what data to pass to the output. In the following table, A is the digital audio output of comparator 101, S$_2$ is the most significant bit from the modulo eight counter, S$_1$ is the second most significant bit, and S$_0$ is the least significant bit. S$_0$ is also equivalent to the input clock divided by two.

TABLE 1

| Clock Phase (S$_2$S$_1$S$_0$) | VOL [1:0] (1,1) −0 dB | VOL [1:0] (1,0) −6 dB | VOL [1:0] (0,1) −12 dB | VOL [1:0] (0,0) OFF |
|---|---|---|---|---|
| 0 (000) | A | A | A | High |
| 1 (001) | A | A | A | High |
| 2 (010) | A | A | S$_0$ | High |
| 3 (011) | A | A | S$_0$ | High |
| 4 (100) | A | S$_0$ | S$_0$ | High |
| 5 (101) | A | S$_0$ | S$_0$ | High |
| 6 (110) | A | S$_0$ | S$_0$ | High |
| 7 (111) | A | S$_0$ | S$_0$ | High |

At the maximum setting (1,1) the digital audio is passed directly to the speaker resulting in no attenuation of the audio signal. At level (1,0) only fifty percent of the audio energy is passed to the speaker. The other fifty percent of the time, two cycles of the clock/2 are transmitted. At level (0,1) only twenty-five percent of the audio signal is sent. The other seventy-five percent of the time, three cycles of the clock/2 is transmitted. The last setting (0,0) turns the audio off completely. This four level control maps into the Hayes modem ATLn and ATMn commands.

It will be obvious to practitioners in the art that the present invention can be implemented with more or fewer attenuation levels than are described in the preferred embodiment. It will also be obvious that the present invention is not limited to the time multiplexing scheme described herein, but may be practiced using other time multiplexing schemes wherein the ratios of audio signal pulse to clock pulse are maintained.

Figure 2:
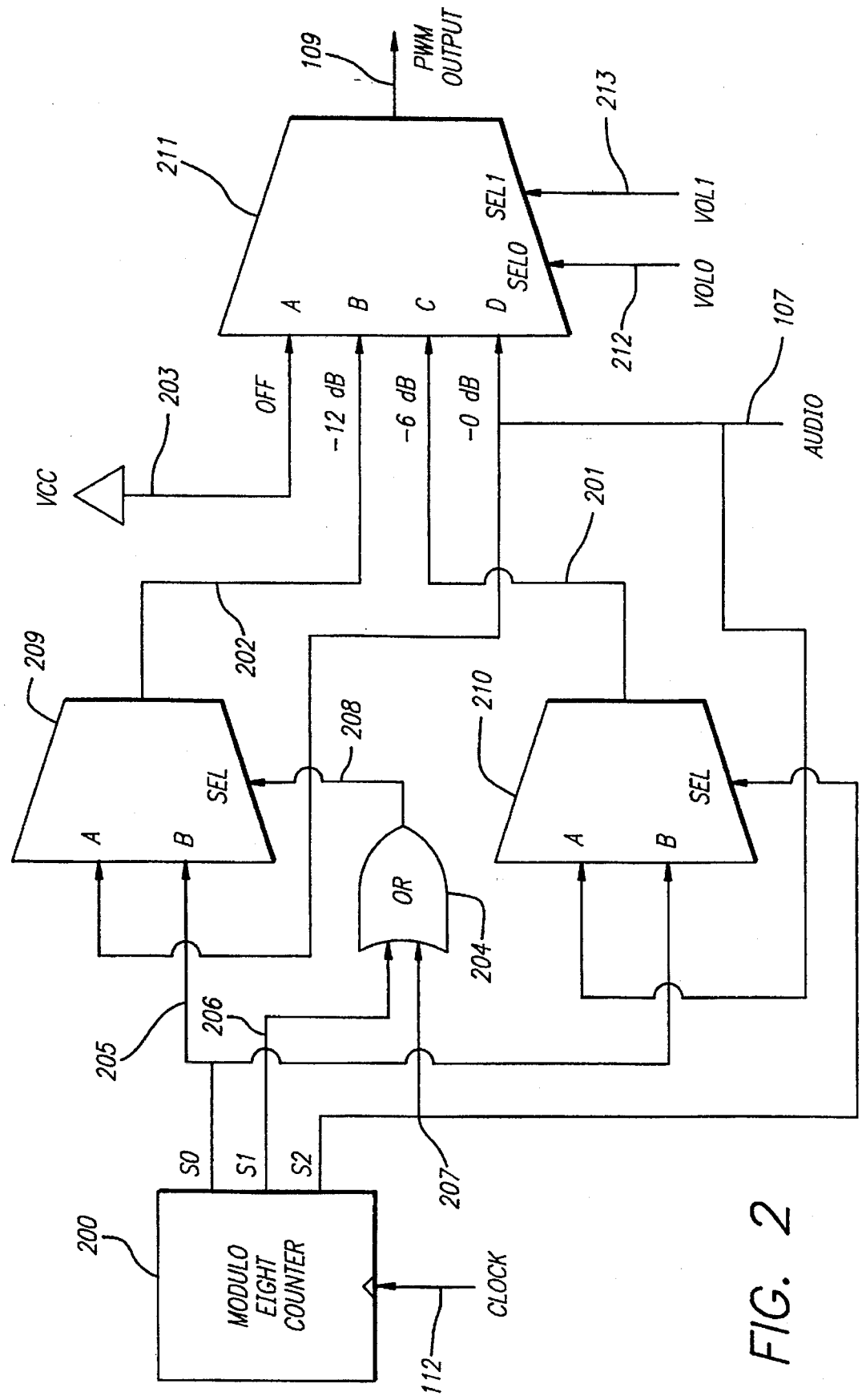
FIG. 2 is a block diagram of the volume control means of the present invention.

FIG. 2 is a circuit block diagram of the preferred embodiment of the present invention. Modulo eight counter 200 receives high frequency clock signal 112 and generates a three bit digital output comprised of signals S$_2$ 207, S$_1$ 206 and S$_0$ 205. Signal S0 205 is provided as input B to multiplexers 209 and 210. Signal S$_1$ 206 is provided to OR gate 204. Signal S$_2$ 207 is provided to OR gate 204 and to select input SEL of multiplexer 210. OR gate 204 provides select signal 208 to select input SEL of multiplexer 209. Digital audio signal 107 is provided as input A to multiplexers 209 and 210, and as input D to multiplexer 211. Multiplexer 209 provides signal 202 to input B of multiplexer 211. Multiplexer 210 provides signal 201 to input C of multiplexer 211. DC voltage 203 is provided to input A of multiplexer 211. Volume control signals VOL0 and VOL1 are coupled to select inputs S0 and S1, respectively, of multiplexer 211. Multiplexer 211 provides PWM output, 109 to the PC interface.

Each combination of the three signals, S$_2$, S$_1$ and S$_0$, represent a single state from zero to seven. S$_2$ is the most significant bit and is equivalent to the input clock divided by eight. S$_1$ is the second most significant bit and is equivalent to the input clock divided by four. S$_0$ is the least significant bit and is equivalent to the input clock divided by two. The modulo eight counter generates state outputs for states zero through seven in consecutive order and then begins again at state zero. In the preferred embodiment, S$_0$ is the high frequency clock signal substituted for the audio signal as specified in table 1. Other embodiments may pass the clock signal 112 to B inputs of multiplexers 209 and 210. The substitution clock signal should be of a sufficiently high frequency that the carrier is not audible.

For multiplexers 209 and 210, the signal provided at input A is passed to the output if the signal at select input SEL is a logical low. The signal at input B is passed if the signal at select input SEL is a logical high. For multiplexer 211, the following input to output mapping is performed:

| SEL0 | SEL1 | Output |
|---|---|---|
| 0 | 0 | A |
| 1 | 0 | B |
| 0 | 1 | C |
| 1 | 1 | D |

The four levels of audio signal output are selected by signals VOL0 212 and VOL1 213. Signal 203 is selected to turn the volume OFF. DC signal 203 will generate no audible signal from the PC speaker. Signal 202 is selected if −12 dB attenuation is desired. Signal 201 is selected for −6 dB of attenuation and signal 107 is selected for unattenuated audio.

As stated before, −12 dB of attenuation is accomplished by substituting a high frequency clock signal seventy-five percent of the time. During states zero and one, signals S$_1$ 206 and S$_2$ 207 are both low resulting in a low select signal from OR gate 204. Audio signal 107 is therefore passed through on signal 202 during states zero and one. During states two through seven, at least one of signals S$_1$ 206 and S$_2$ 207 are high at any time resulting in a high select signal from OR gate 204. A high frequency clock signal (S₀ 205) is therefore passed through to signal 202 during states two through seven.

−6 dB attenuation is accomplished by substituting equal portions of high frequency clock for portions of audio signal. During states zero through three, S₂ 207 is low and multiplexer 210 passes audio signal 107 to signal 201. During states four through seven, S₂ 207 is high and multiplexer 210 passes S₀ 205 to signal 201. Thus an even, alternating cycle is established and −6 dB of attenuation is achieved.

Figure 4:
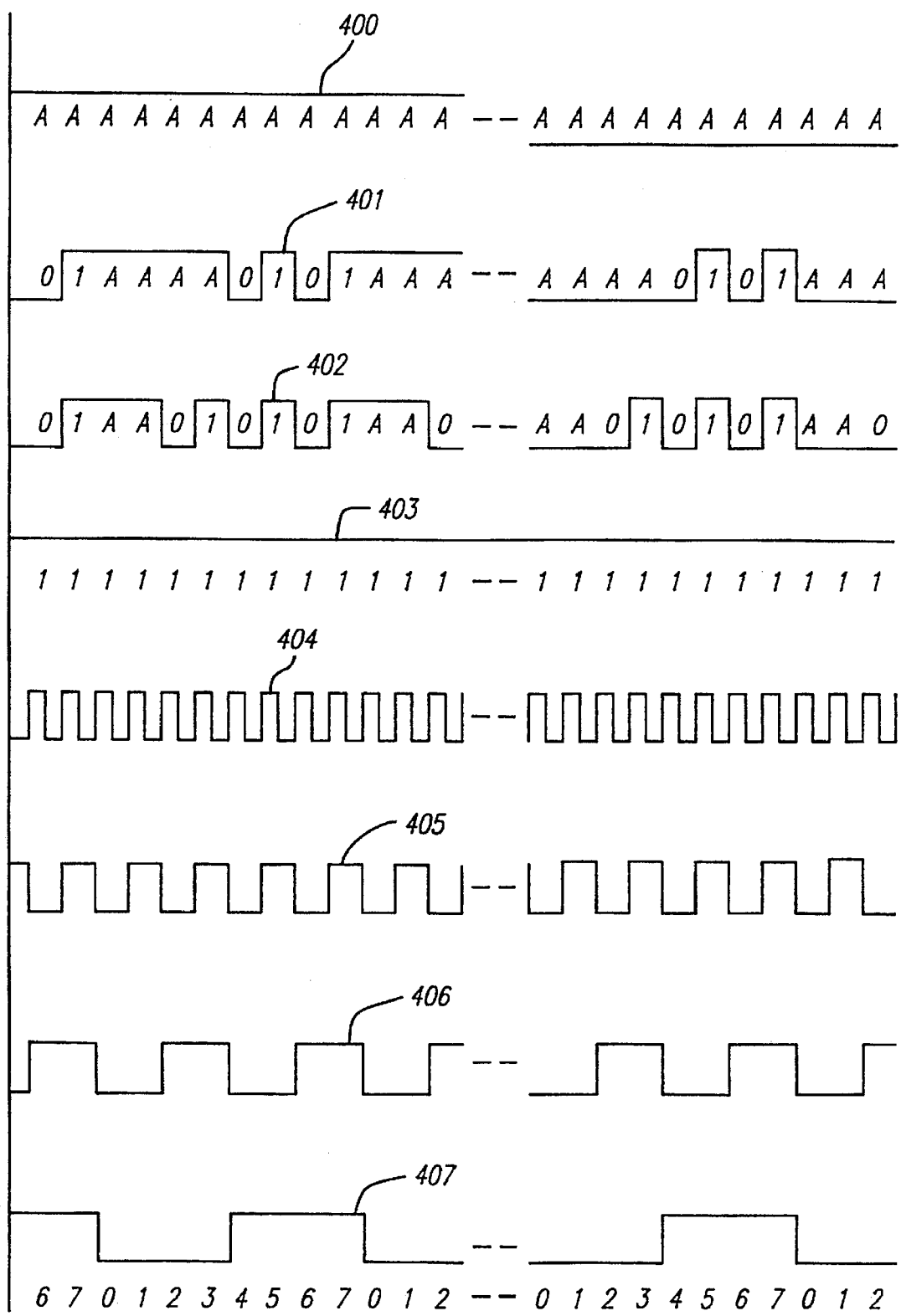
FIG. 4 is a timing diagram illustrating the pulse width modulation technique of the present invention.

FIG. 4 is a timing diagram of voltage levels at specific nodes in FIG. 2. Waveforms 400, 401, 402, 403 and 404 correspond to signals 107, 201, 202, 203 and 112, respectively. Waveforms 405, 406 and 407 correspond to signals 205, 206 and 207, respectively.

Waveform 404 is the input clock waveform to the volume control circuit. The rising edge of each clock cycle indicates the beginning of one of the eight states. However, falling edge triggered logic can be used to design an equivalent system. State values are given at the bottom of FIG. 4. Waveform 405 represents the least significant bit of the counter. Waveform 405 toggles between high and low values at every rising edge of clock waveform 404. As shown, waveform 405 is high during odd states and low during even states.

Waveform 406 toggles on the falling edge of waveform 405. Beginning at a logical low in states zero and one, waveform 406 transitions once every two states. Waveform 407 represents the most significant bit of the counter and toggles once every four states on the failing edge of waveform 406. Waveform 407 is therefore low during states zero through three and high during states four through seven.

Waveform 400 represents the unattenuated digital audio signal. The audio value is indicated by the presence of the letter A within the waveform. The waveform is separated into two segments, the first having an audio signal value of "1", and the second having an audio signal value of "0". These values correspond to standard digital logic level representation of logical highs and lows as 1's and 0's, respectively.

The −6 dB attenuated signal is represented by waveform 401. In accordance with table 1 and the architecture of FIG. 2, the digital audio signal is presented in states zero through three, whereas waveform 405 is presented during states four through seven. Similarly for the −12 dB attenuated signal, waveform 402, the digital audio is presented during states zero and one, whereas waveform 405 is presented during states three through seven.

Waveform 403 is a DC signal and thus remains constant. No audio information is passed and the electroacoustic transducer in the speaker is inactive. This represents the fully attenuated signal and generates no audible sound from the speaker. A high frequency clock may be presented in all states in place Of the DC signal, but the low pass filtering of the PC and speaker may pass some highly attenuated low frequency harmonics of the clock signal to the speaker.

Figure 5:
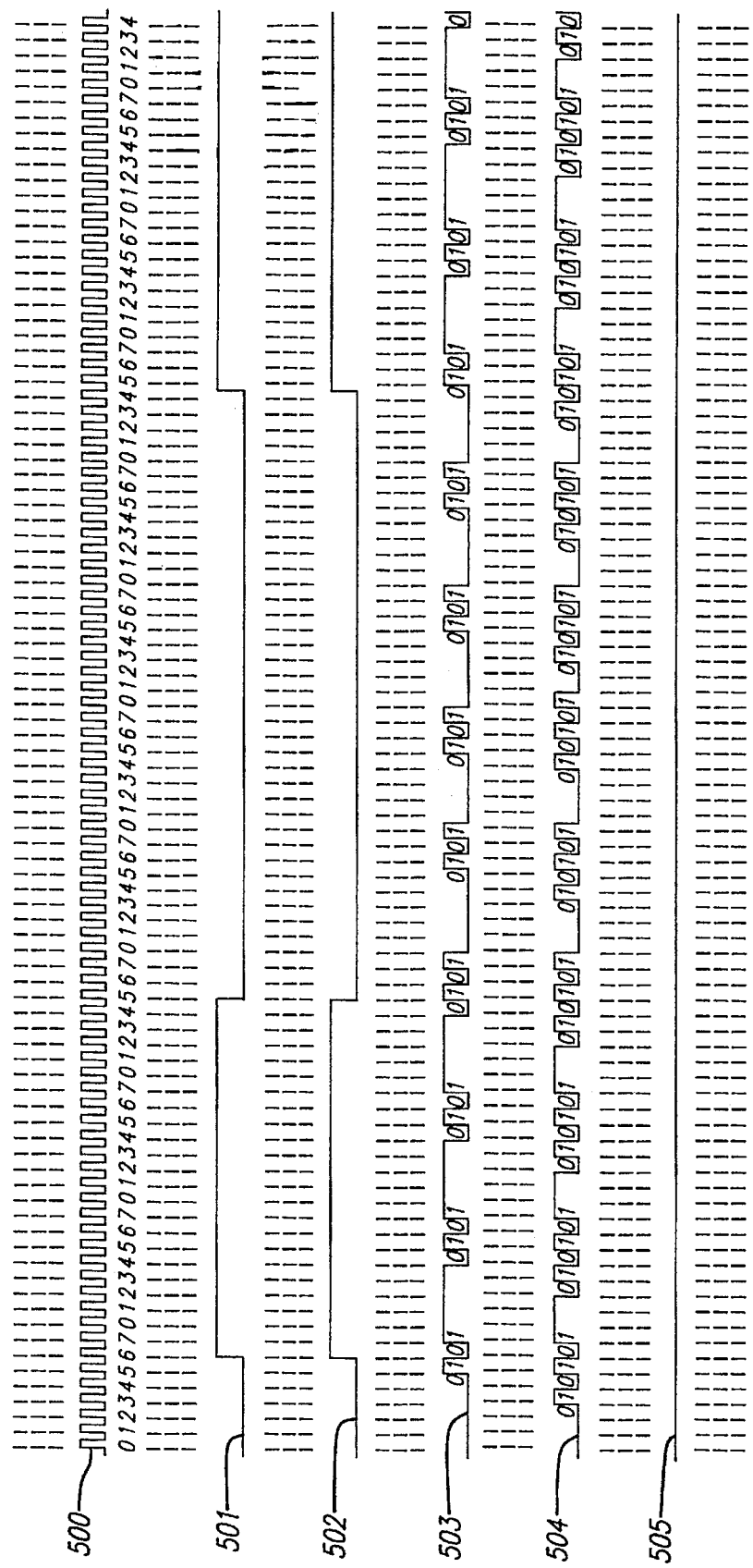
FIG. 5 is a timing diagram showing the audio input and output over several cycles.

FIG. 5 is a timing diagram of the input audio signal and the modified audio output signals over several cycles. Signal 500 is the high speed clock signal, signal 50i is the sampled audio input signal, and signals 502–505 are the audio output signals for −0 dB, −6 dB, −12 dB attenuation and "off", respectively. As expected, signal 502 tracks signal 501. Signal 503 has a shared signal composed of time multiplexed signals in equal proportion. The audio input is multiplexed onto the line for four clock cycles followed by four clock cycles of a toggling signal. Signal 504 is multiplexed in a 3:1 ratio of toggling signal to audio input to achieve the desired −12 dB attenuation. Signal 505 is a flat line indicative of no signal or "off".

In other embodiments of the present invention, more or less states can be used to subdivide the audio signal. Also, the high frequency signal may be substituted for the audio signal in different states than are here described, including nonconsecutive states. The embodiment described herein is preferred for its compatibility with present modem schemes, primarily Hayes modem ATLn and ATMn commands.

Thus, a novel method and apparatus for controlling the volume of a PC internal speaker have been described.

We claim:

1. An apparatus for controlling signal power comprising:

interval partitioning means receiving a clock signal, said interval partitioning means generating at least one toggling signal for providing a plurality of phases;

first selection means coupled to said interval partitioning means and receiving an input signal, said first selection means selectively outputting said at least one toggling signal or said input signal depending upon a first select signal;

averaging means coupled to said first selection means, said averaging means providing an averaged output signal;

at least one additional selection means coupled to said interval partitioning means and receiving said input signal, said at least one additional selection means providing at least one additional selected signal, wherein said at least one additional selected signal comprises said input signal during a first phase of a second select signal, and wherein said at least one additional selected signal comprises said toggling signal during a second phase of said second select signal; and controlling means coupled between said first selection means and said at least one additional selection means and said averaging means, said controlling means receiving a control signal, said controlling means providing a first selection means output to said averaging means when said control signal is a first value, said controlling means providing one of said at least one additional selected signals to said averaging means when said control signal is a second value.

2. An apparatus for controlling signal power comprising:

a counter for receiving a clock signal and providing a toggling signal having a plurality of phases;

a selector coupled to said counter and receiving an input signal, said selector selectively outputting said toggling signal or said input signal depending upon a select signal input, said select signal being independent of said input signal;

a filter coupled to said selector, said filter providing an averaged output signal;

at least one additional selector coupled to said counter and receiving said input signal, said at least one additional selector providing at least one additional selected signal, wherein said at least one additional selected signal comprises said input signal during a first phase of a second select signal, and wherein said at least one additional selected signal comprises said toggling signal during a second phase of said second select signal; and a controller coupled between said selector and said at least one additional selector and said filter, said controllers receiving a control signal, said controller providing a selector output to said filter when said control signal is a first value, said controller providing said at least one additional selected signal to said filter when said control signal is a second value.

3. The apparatus of claim 1 wherein said averaging means has a first frequency range, said input signal has a second frequency range, said clock signal has a first frequency value, said toggling signal has a second frequency value, and wherein said second frequency range is within said first frequency range, said first and second frequency values are outside of said first frequency range.

4. The apparatus of claim 3 wherein said clock signal and said toggling signal are equivalent.

5. The apparatus of claim 1 wherein said select signal is independent of said input signal.

6. The apparatus of claim 2 wherein said filter has a first frequency range, said input signal has a second frequency range, said clock signal has first frequency value, said toggling signal has a second frequency value, and wherein said second frequency range is within said first frequency range, and said first and second frequency values are outside of said first frequency range.

7. The apparatus of claim 6 wherein said clock signal and said toggling signal are equivalent.

* * * * *